US012805394B2

(12) United States Patent
Pachamuthu et al.

(10) Patent No.: US 12,805,394 B2
(45) Date of Patent: Nov. 17, 2026

(54) THERMALLY CONDUCTIVE SPACER

(71) Applicant: Sandisk Technologies, Inc., Milpitas, CA (US)

(72) Inventors: Jayavel Pachamuthu, San Jose, CA (US); Niles Yang, Mountain View, CA (US); Daniel J. Linnen, Limestone, TN (US); Kirubakaran Periyannan, Saratoga, CA (US)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 601 days.

(21) Appl. No.: 18/359,645

(22) Filed: Jul. 26, 2023

(65) Prior Publication Data

US 2024/0404994 A1 Dec. 5, 2024

Related U.S. Application Data

(60) Provisional application No. 63/506,323, filed on Jun. 5, 2023.

(51) Int. Cl.

*H10W 90/00* (2026.01)
*H10B 80/00* (2023.01)
*H10W 40/22* (2026.01)
*H10W 90/20* (2026.01)
*H10W 90/24* (2026.01)

(52) U.S. Cl.
CPC ............ *H10W 90/00* (2026.01); *H10B 80/00* (2023.02); *H10W 40/228* (2026.01); *H10W 90/231* (2026.01); *H10W 90/24* (2026.01); *H10W 90/288* (2026.01); *H10W 90/752* (2026.01); *H10W 90/754* (2026.01)

(58) Field of Classification Search
CPC ...................... H01L 23/36; H01L 2225/06562
See application file for complete search history.

(56) References Cited

U.S. PATENT DOCUMENTS

2013/0093103 A1* 4/2013 Kim .................... H01L 25/0657 257/777

* cited by examiner

*Primary Examiner* — Yu-Hsi D Sun
(74) *Attorney, Agent, or Firm* — Dentons Durham Jones Pinegar P.C.

(57) ABSTRACT

A thermally conductive spacer is positioned between two semiconductor dies in a stack of semiconductor dies. The spacer includes thermal conductivity features that dissipate heat or otherwise conduct heat away from the semiconductor dies in the stack. The spacer may have dimensions that are larger than the dimensions of the semiconductor dies in the stack. The thermal conductivity features of the spacer, in addition to the larger dimensions, enable the spacer to effectively dissipate heat from, and improve a thermal profile of, the stack of semiconductor dies.

20 Claims, 6 Drawing Sheets

THERMALLY CONDUCTIVE SPACER

CROSS-REFERENCE TO RELATED APPLICATIONS

The present application claims priority to U.S. Provisional Application 63/506,323 entitled "THERMALLY CONDUCTIVE SPACER", filed Jun. 5, 2023, the entire disclosure of which is hereby incorporated by reference in its entirety.

BACKGROUND

Die stacking is a process in which multiple semiconductor dies are stacked on top of each other and are interconnected to form a single unit. A stack of semiconductor dies is typically included in a semiconductor package to increase the performance, integration, and functionality of the semiconductor package, while also reducing a form factor of the semiconductor package.

Spacers are often included in the stack of semiconductor dies. Spacers are used to ensure proper alignment and spacing of the semiconductor dies in the stack and to provide mechanical support. Spacers may also create spaces between the stacked semiconductor dies, which helps improve airflow and heat dissipation.

Spacers are typically made from the same materials as the dies, i.e., silicon, so that they have matching coefficients of thermal expansion. Semiconductor dies located at or near the middle of the stack are more susceptible to heat than other semiconductor dies in the stack. If heat is not effectively dissipated from the semiconductor dies in the stack, an operating temperature of the semiconductor package may increase. As the operating temperature of the semiconductor package increases, the performance and/or the reliability of the semiconductor package may decrease.

Accordingly, it would be beneficial for a semiconductor package to have thermal dissipation features that effectively and efficiently dissipate heat from a stack of semiconductor dies.

SUMMARY

The present application describes a thermally conductive spacer for a semiconductor package. The thermally conductive spacer includes one or more thermal conductivity features that conduct heat away from semiconductor dies that form a stack of semiconductor dies (also referred to as a "stack"). In addition to the thermal conductivity features, the thermally conductive spacer has dimensions that are larger than the dimensions of one or more of the semiconductor dies in the stack of semiconductor dies. The thermal conductivity features, in addition to the larger dimensions of the thermally conductive spacer, enable the thermally conductive spacer to effectively dissipate heat from, and improve a thermal profile of, the semiconductor dies in the stack-especially for semiconductor dies that are located at or near the center of the stack.

Accordingly, the present application describes a semiconductor package that includes a printed circuit board (PCB), a first stack of semiconductor dies and a second stack of semiconductor dies. The semiconductor package also includes a thermally conductive spacer provided between the first stack of semiconductor dies and the second stack of semiconductor dies. In an example, the thermally conductive spacer includes a thermal conductivity feature that moves heat generated by the semiconductor dies adjacent to the thermally conductive spacer away from the adjacent semiconductor dies.

In another example, the present application describes a semiconductor package that includes a printed circuit board (PCB) and a stack of memory dies. In an example, each memory die of the stack of memory dies has a first set of dimensions. The semiconductor package also includes a thermally conductive spacer having a thermal conductivity feature. The thermally conductive spacer is provided between a first memory die of the stack of memory dies and a second memory die of the stack of memory dies. The thermally conductive spacer has a second set of dimensions that are larger than the first set of dimensions.

The present application also describes a semiconductor package that includes a printed circuit board (PCB), a first stack of integrated circuit means and a second stack of integrated circuit means. A thermally conductive spacing means is provided between the first stack of integrated circuit means and the second stack of integrated circuit means. The thermally conductive spacing means includes a thermal conductivity means. The thermally conductive spacing means also has a set of dimensions that are greater than a set of dimensions of at least one integrated circuit means in the first stack of integrated circuit means.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

As previously indicated, die stacking is a process in which multiple semiconductor dies are stacked on top of each other and are interconnected to form a single unit. Spacers are often included in the stack of semiconductor dies to ensure proper alignment and spacing and to provide mechanical support. Spacers may also help improve airflow and heat dissipation.

However, spacers are typically made from materials with low thermal conductivity properties. Additionally, silicon (which is used to form semiconductor dies) also has low thermal conductivity properties. Thus, semiconductor dies that are located at or near the middle of the stack may be more susceptible to heat than other semiconductor dies in the stack. If heat is not effectively dissipated from the semiconductor dies in the stack, an operating temperature of the semiconductor package may increase. As the operating temperature of the semiconductor package increases, the performance and/or the reliability of the semiconductor package may decrease.

In order to address the above, the present application describes a thermally conductive spacer for a semiconductor package. The thermally conductive spacer is placed between two semiconductor dies in the stack. The thermally conductive spacer includes one or more thermal conductivity features that dissipate heat or otherwise conduct heat away from one or more of the semiconductor dies in the stack.

In addition to the thermal conductivity features, the thermally conductive spacer has one or more dimensions that are larger than one or more dimensions of one or more of the semiconductor dies in the stack. The thermal conductivity features, in addition to the larger dimensions of the thermally conductive spacer, enable the thermally conductive spacer to effectively dissipate heat from, and improve a thermal profile of, the stack of semiconductor dies—especially for semiconductor dies that are located at or near the center of the stack.

Accordingly, many technical benefits may be realized including, but not limited to, improving thermal dissipation properties of a semiconductor package; lower operating temperatures of the semiconductor package; and improving mechanical stability of a stack of semiconductor dies within semiconductor packages.

These benefits, along with other examples, will be shown and described in greater detail with respect to FIG. 1-FIG. 6.

Figure 1:
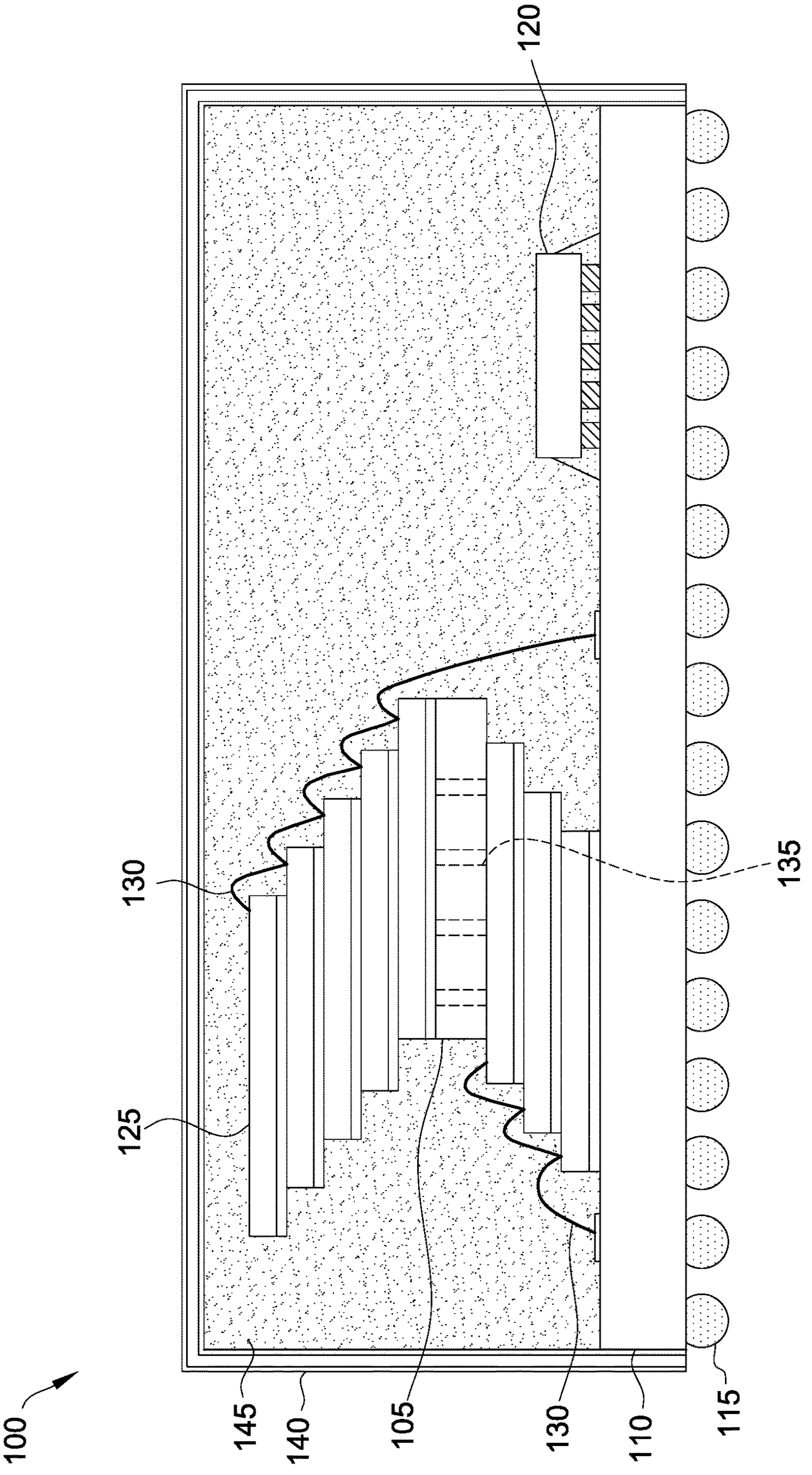
FIG. 1 illustrates a semiconductor package having a thermally conductive spacer according to an example.

FIG. 1 illustrates a semiconductor package 100 having a thermally conductive spacer 105 according to an example. The thermally conductive spacer 105 may have one or more thermally conductive features that enables heat to be effectively transferred away from one or more electronic components of the semiconductor package 100.

In an example, the semiconductor package 100 includes a substrate or a printed circuit board (PCB) 110. One or more solder balls 115 may be provided on a bottom surface of the PCB 110. The solder balls 115 may be used to electronically and/or communicatively couple the semiconductor package 100 to a computing component or an electronic device. Although solder balls 115 are shown and described, other connection means may be used to electronically and/or communicatively couple the semiconductor package 100 to a computing component or an electronic device.

The semiconductor package 100 may also include a controller 120 or other integrated circuit. The controller 120 may be mounted on a top surface of the PCB 110 using any suitable surface mounting process and electrically connected to the PCB 110 with conductive balls (as shown) or with bond wires for a non-BGA package controller.

The semiconductor package 100 also includes a stack of semiconductor dies 125. The stack of semiconductor dies 125 may be formed by one or more semiconductor dies that are physically stacked on top of one another and/or are interconnected. In an example, the stack of semiconductor dies 125 is a stack of NAND memory dies. Although NAND memory dies are specifically mentioned, the semiconductor package 100 may include any type stackable semiconductor dies and/or stackable integrated circuits.

A bond wire 130 may be used to communicatively couple each semiconductor die in the stack of semiconductor dies 125 to the PCB 110. In the example shown, a first bond wire 130 is used to communicatively couple a first portion of the stack of semiconductor dies 125 to the PCB 110 while a second bond wire 130 is used to communicatively couple a second portion of the stack of semiconductor dies 125 to the PCB 110.

In this example, the thermally conductive spacer 105 is positioned between a first semiconductor die of the stack of semiconductor dies 125 and a second semiconductor die of the stack of semiconductor dies 125. The thermally conductive spacer 105 includes one or more thermal conductivity features that move heat generated by the semiconductor dies adjacent to the thermally conductive spacer 105 away from the adjacent semiconductor dies. Although a single thermally conductive spacer 105 is shown, multiple thermally conductive spacers 105 may be included between, on or under one or more semiconductor dies of the stack of semiconductor dies 125.

In an example, the thermally conductive spacer 105 is positioned between semiconductor dies that are at or near a center of the stack of semiconductor dies 125, as these dies may be more susceptible to higher temperatures. In another example, the thermally conductive spacer 105 may be coupled to the PCB 110 and positioned below the stack of semiconductor dies 125. In yet another example, the thermally conductive spacer 105 may be positioned on a top surface of the controller 120.

In an example, each semiconductor die of the stack of semiconductor dies 125 has a set of dimensions (e.g., a length, a width, and a height). Each semiconductor die in the stack of semiconductor dies 125 may have the same dimensions or different dimensions.

The thermally conductive spacer 105 also has a set of dimensions (e.g., a length, a width and a height). In an example, at least one of the dimensions of the thermally conductive spacer 105 is greater than a corresponding dimension of at least one semiconductor die in the stack of semiconductor dies 125. In another example, all of the dimensions of the thermally conductive spacer 105 are greater than all of the dimensions of each semiconductor die in the stack of semiconductor dies 125.

Because the dimensions of the thermally conductive spacer 105 are greater than the dimensions of the semiconductor dies in the stack of semiconductor dies 125, one or more surfaces of the thermally conductive spacer 105 may extend beyond one or more of the semiconductor dies in the stack of semiconductor dies 125. As such, one or more of the surfaces of the thermally conductive spacer 105 may be used to spread heat away from the semiconductor dies in the stack of semiconductor dies 125.

Additionally, a location of the thermally conductive spacer 105 with respect to the stack of semiconductor dies 125 may be moved. For example, the thermally conductive spacer 105 may be moved forward, backward, to the left and/or to the right with respect to the semiconductor dies in the stack of semiconductor dies 125 to expose different surfaces on different sides of the stack of semiconductor dies 125.

As previously discussed, the thermally conductive spacer 105 also includes one or more thermally conductive features. The thermal conductivity features move heat that is generated by the semiconductor dies adjacent to the thermally conductive spacer away from the adjacent semiconductor dies. The thermally conductive features promote thermal consistency of the semiconductor dies within the stack of semiconductor dies 125 (and within the semiconductor package 100).

For example, the thermally conductive spacer 105 may be formed from, or otherwise include, a thermal conductive material (e.g., an alumina substrate, metal). In such an example, the material that forms the thermally conductive spacer 105 may have a temperature coefficient of expansion that is equivalent, or substantially equivalent, to a temperature coefficient of expansion of silicon. This may help reduce mechanical stress on the stack of semiconductor dies 125 and/or the semiconductor package 100.

In another example, the thermally conductive spacer 105 includes one or more vias 135. The vias 135 may extend completely through the thermally conductive spacer 105 and/or partially through the thermally conductive spacer 105. Additionally, the vias 135 may extend in one or more directions (e.g., vertically, horizontally) within the thermally conductive spacer 105. In examples in which vias 135 are used, the vias 135 may be filled with thermally conductive materials.

In yet another example, the thermally conductive spacer 105 includes thermally conductive materials that are printed or otherwise provided on one or more surfaces (e.g., a top surface, a bottom surface and/or one or more sides). In an example, the conductive materials may be formed from a metal or other material and may also be arranged in one or more patterns (e.g., lines, bars, a grid). In examples in which thermally conductive materials are provided on the one or more surfaces of the thermally conductive spacer 105, additional thermally conductive materials may be provided on the surfaces to help improve thermal conductivity properties of the materials and may also help secure the semiconductor dies of the stack of semiconductor dies 125 to the thermally conductive spacer 105.

The thermally conductive spacer 105 may also include one or more pads on one or more surfaces. When pads are used, the pads may be placed at or near an edge of the thermally conductive spacer 105. In an example, the pads may be comprised of a thermally conductive material and/or may be enlarged (e.g., using a soldering or plating process) so as to provide a greater surface area from which to dissipate heat.

In yet another example, the thermally conductive spacer 105 may include one or more tines or leads that extend from the surface and/or the pads. The tines or leads may extend in any direction. In one example, the tines may extend from the thermally conductive spacer 105 to the PCB 110. In such an example, the tines may extend into the PCB 110 and/or be electrically coupled to one or more of the solder balls 115 which may help dissipate heat from the semiconductor package 100.

In another example, the tines may extend into a cover 140 that encases the semiconductor package 100. In an example, cover 140 includes multiple layers of metal and acts as a thermal dissipation layer. For example, the cover 140 may be formed from of one or more SUS layers (e.g., FR4, aluminum, and/or stainless steel) and/or one or more copper layers (e.g., sandwiched between multiple SUS layers). In another example, the cover 140 may include one or more tin layers, one or more copper layers, one or more nickel layers and/or one or more aluminum layers. Although specific layers/materials are mentioned, the cover 140 may be formed from any metal material having thermal/electrical conductivity properties. In an example, and depending on the material used, the cover 140 may act as a thermal dissipation layer and as an electromagnetic interference (EMI) layer.

The semiconductor package 100 may also include a molding material 145 or a molding compound. The molding material 145 may be any suitable molding material (e.g., an epoxy molding compound) having heat dissipation properties. The molding material 145 may be used to encase the stack of dies 125, the bond wire 130, the thermally conductive spacer 105 and the controller 120. Because the molding material 145 encases the thermally conductive spacer 105 and because one or more surfaces of the thermally conductive spacer 105 extend beyond the semiconductor dies of the stack of semiconductor dies 125, the molding material 145 may contact one or more thermal dissipation features of the thermally conductive spacer 105 which helps dissipate heat from the semiconductor dies.

In an example, some or all of the various thermally conductive features may be combined or otherwise included with a single thermally conductive spacer 105 that is included in a semiconductor package 100. In another example, some or all of the various thermally conductive features may be combined or otherwise included with different (or multiple) thermally conductive spacers 105 that are provided or otherwise included in a semiconductor package 100.

Figure 2:
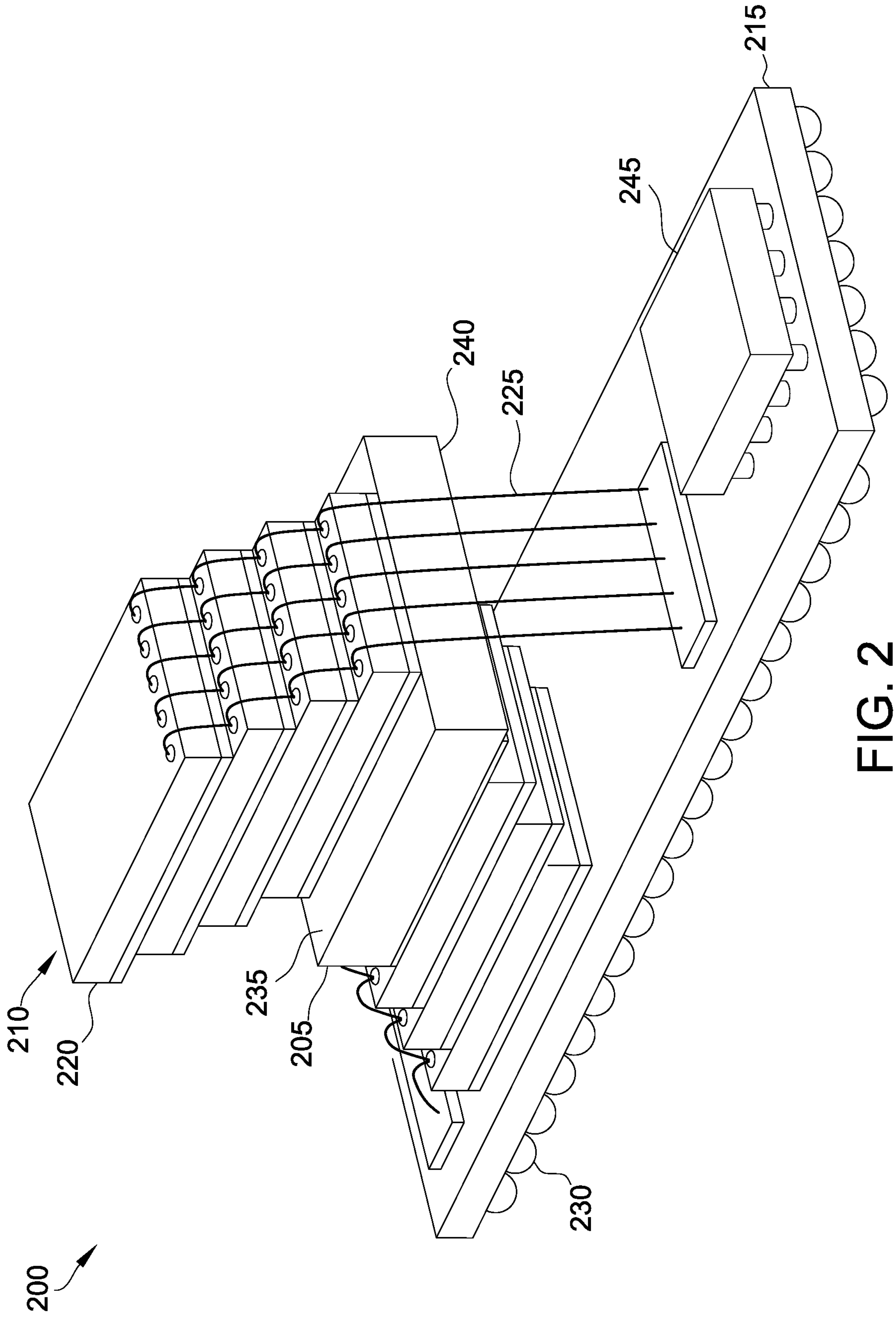
FIG. 2 illustrates an isometric view of various components of a semiconductor package according to an example.

FIG. 2 illustrates an isometric view of various components of a semiconductor package 200 according to an example. The semiconductor package 200 may be similar to the semiconductor package 100 shown and described with respect to FIG. 1.

For example, the semiconductor package 200 includes a controller 245 or other integrated circuit. The controller 245 may be mounted on a top surface of a substate or printed circuit board (PCB) 215 using any suitable surface mounting process. The semiconductor package 200 may also include a stack of semiconductor dies 210 coupled to the PCB 215. The stack of semiconductor dies 210 includes one or more semiconductor dies 220 or integrated circuits. A bond wire 225 electrically and/or communicatively couples each semiconductor die 220 of the stack of semiconductor dies 210 to the PCB 215. Solder balls 230 provided on a bottom surface of the PCB 215 may be used to couple the semiconductor package 200 to a computing component or an electronic device.

The semiconductor package 200 also includes a thermally conductive spacer 205. The thermally conductive spacer 205 may be similar to the thermally conductive spacer 105 shown and described with respect to FIG. 1. In an example, the thermally conductive spacer 205 is positioned between two semiconductor dies of the stack of semiconductor dies 210. The thermally conductive spacer 205 may also have a set of dimensions (or at least one dimension) that is larger than a set of dimensions (or a corresponding dimension) of one or more of the semiconductor dies 220 in the stack of semiconductor dies 210.

For example, a height or a thickness of the thermally conductive spacer 205 may be greater than a height or a thickness of one or more semiconductor dies 220 in the stack of semiconductor dies 210. In another example, a width of the thermally conductive spacer 205 may be greater than a width of one or more semiconductor dies 220 in the stack of semiconductor dies 210. In yet another example, a length of the thermally conductive spacer 205 may be greater than a length of one or more semiconductor dies 220 in the stack of semiconductor dies 210.

In order to dissipate heat from one or more of the semiconductor dies 220 of the stack of semiconductor dies 210, the thermally conductive spacer 205 is positioned between two semiconductor dies of the stack of semiconductor dies 210. In an example, the thermally conductive spacer 205 is positioned at or near the middle of the stack of semiconductor dies 210. Although a single thermally conductive spacer 205 is shown, multiple thermally conductive spacers 205 may be used in a single stack of semiconductor dies 210.

Due to the difference in dimensions between the thermally conductive spacer 205 and the semiconductor dies 220, a portion of a top surface 235 and/or a portion of a bottom surface 240 of the thermally conductive spacer 205 may be exposed or otherwise extend beyond the semiconductor dies 220. As previously described, the exposed surfaces of the thermally conductive spacer 205 may help radiate heat away from one or more semiconductor dies 220 of the stack of semiconductor dies 210. For example, as more surfaces, and a greater surface area of the spacer 205, are used to dissipate heat (e.g., through a molding material, a molding compound and/or a thermal dissipation cover), the more effective heat dissipation may be.

Figure 3A:
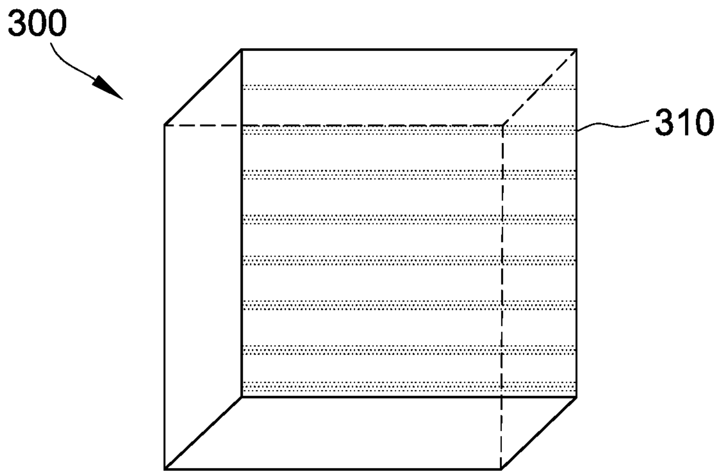
FIG. 3A illustrates a thermally conductive spacer having a first thermally conductive feature according to an example.

FIG. 3A illustrates a thermally conductive spacer 300 having a first thermally conductive feature 310 according to an example. In an example, the thermally conductive spacer 300 is similar to the thermally conductive spacer 105 shown and described with respect to FIG. 1.

In this example, the thermally conductive feature 310 is a layer of metal (or other conductive material) provided on a surface of the thermally conductive spacer 300. The layer of metal is formed into one or more lines or bars. The bars may extend across the entire surface of the thermally conductive spacer 300 or partially across the surface of the thermally conductive spacer 300. Although bars are shown, the thermally conductive feature may have any shape or arrangement.

Figure 3B:
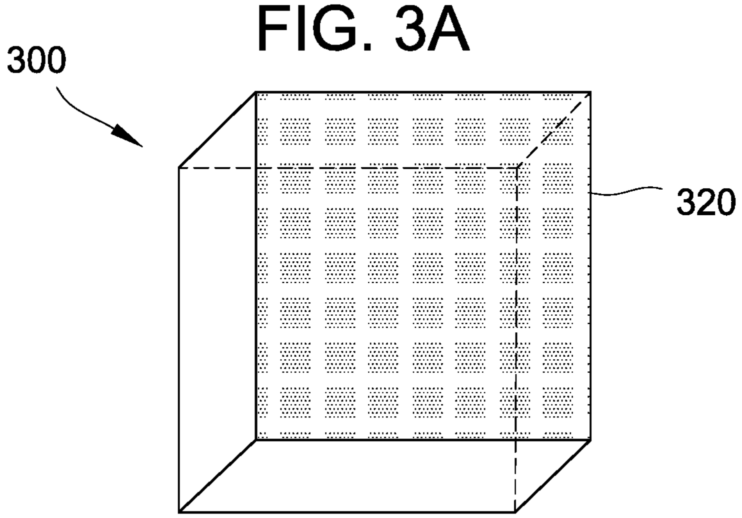
FIG. 3B illustrates a thermally conductive spacer having a second thermally conductive feature according to an example.

FIG. 3B illustrates a thermally conductive spacer 300 having a second thermally conductive feature 320 according to an example. In an example, the thermally conductive spacer 300 is similar to the thermally conductive spacer 105 shown and described with respect to FIG. 1.

In this example, the thermally conductive feature 320 is a layer of metal (or other conductive material) that is arranged in a grid. The grid may extend across the entire surface of the thermally conductive spacer 300 or partially across the surface of the thermally conductive spacer 300.

Figure 3C:
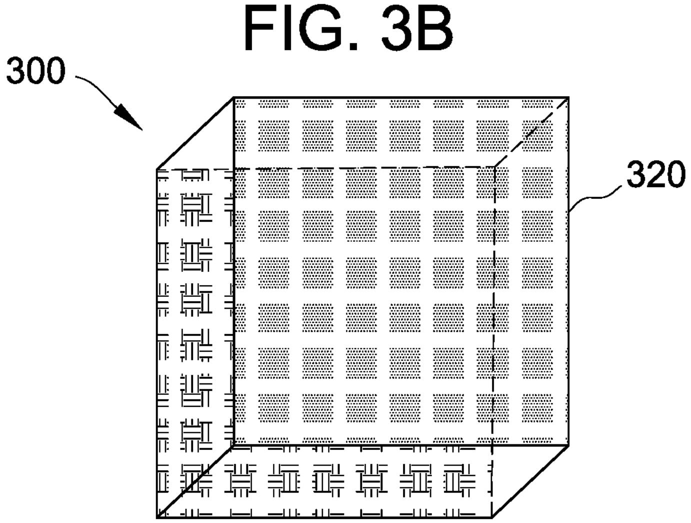
FIG. 3C illustrates a thermally conductive spacer having a thermally conductive feature provided on multiple surfaces according to an example.

FIG. 3C illustrates a thermally conductive spacer 300 having a thermally conductive feature 320 provided on multiple surfaces according to an example. In an example, the thermally conductive spacer 300 is similar to the thermally conductive spacer 105 shown and described with respect to FIG. 1. As with other examples described herein, the thermally conductive feature 320 may extend across the entire top and bottom surfaces of the thermally conductive spacer 300 or partially across the one or more of the top and bottom surfaces of the thermally conductive spacer 300.

Figure 4:
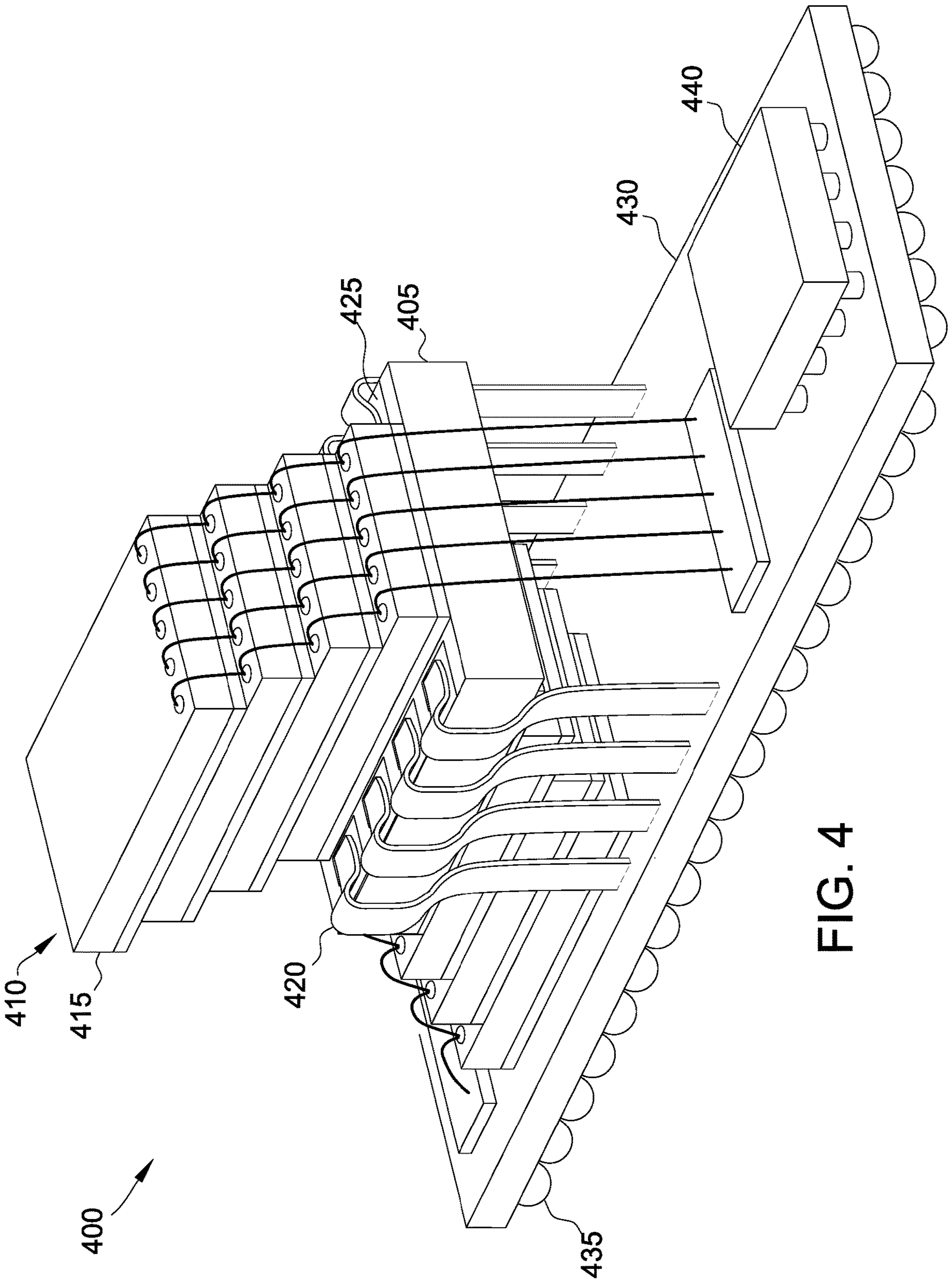
FIG. 4 illustrates an isometric view of a semiconductor package having a thermally conductive spacer with a thermally conductive feature according to an example.

FIG. 4 illustrates an isometric view of a semiconductor package 400 having a thermally conductive spacer 405 with a thermally conductive feature according to an example. The semiconductor package 400 may be similar to the semiconductor package 100 shown and described with respect to FIG. 1. Likewise, the thermally conductive spacer 405 may be similar to the thermally conductive spacer 105 shown and described with respect to FIG. 1. For example, the semiconductor package 400 includes a controller 440 or other integrated circuit, a stack of semiconductor dies 410 and a thermally conductive spacer 405.

In this example, the thermally conductive feature includes one or more tines 420 or leads that extend from a surface of the thermally conductive spacer 405. The tines 420 may extend from a top surface of the thermally conductive spacer 405 or a bottom surface of the thermally conductive spacer 405.

The thermally conductive spacer 405 may also include one or more pads 425 provided on the top surface and/or the bottom surface. In this example, a tine 420 is coupled to each pad 425. The pads 425, along with the tines 420 (along with other thermally conductive features), may help dissipate heat from one or more semiconductor dies 415 of the stack of semiconductor dies 410.

In this example, the tines 420 extend from the spacer 405 to a printed circuit board (PCB) 430 of the semiconductor package 400. In such an example, the tines 420 may be electrically coupled to one or more solder balls 435 provided on a bottom surface of the PCB 430 which may further help dissipate heat from the semiconductor package 400.

In an example, the tines 420 may contact one or more semiconductor dies 415 in the stack of semiconductor dies 410 to provide mechanical support. In another example, the tines 420 may act as a cage or other protective feature for the stack of semiconductor dies 410.

In either example, the tines 420 may help protect or may otherwise prevent the stack of semiconductor dies 410 from moving if the semiconductor package 400 is dropped. In another example, the semiconductor package 400 may be removed and/or inserted into a computing component or an electronic device multiple times. Accordingly, the tines 420 may increase a mechanical strength of the stack of semiconductor dies 410 and/or the semiconductor package 400.

Figure 5:
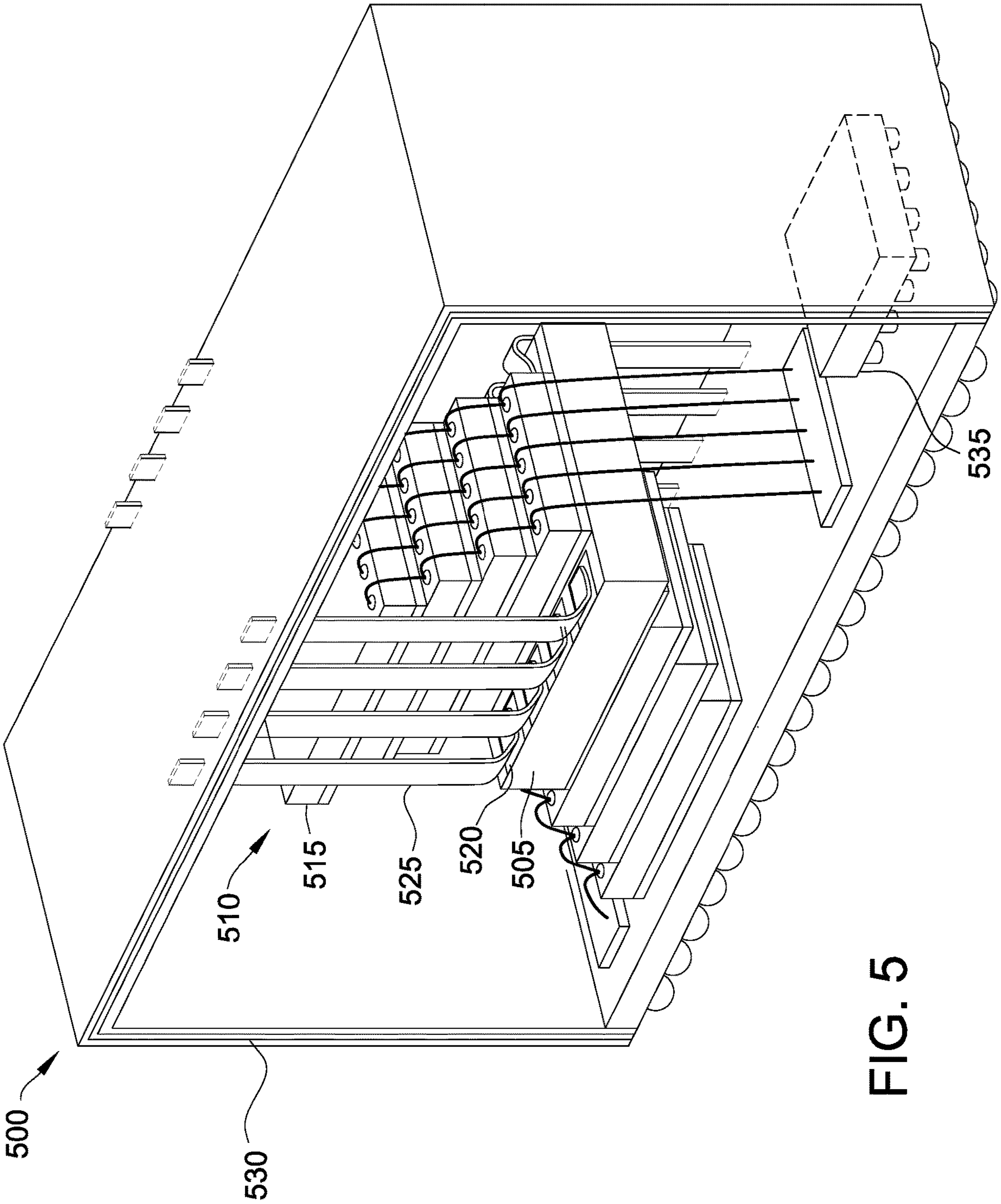
FIG. 5 illustrates an isometric view of a semiconductor package having a thermally conductive spacer with another thermally conductive feature according to an example.

FIG. 5 illustrates an isometric view of a semiconductor package 500 having a thermally conductive spacer 505 with another thermally conductive feature according to an example. The semiconductor package 500 may be similar to the semiconductor package 100 shown and described with respect to FIG. 1. Likewise, the thermally conductive spacer 505 may be similar to the thermally conductive spacer 105 shown and described with respect to FIG. 1. For example, the semiconductor package 500 includes a controller 535 or other integrated circuit, a stack of semiconductor dies 510 and a thermally conductive spacer 505.

In this example, the thermally conductive spacer 505 includes one or more tines 525 or leads that extend from a surface of the thermally conductive spacer 505 to a cover 530 of the semiconductor package 500. For example, the tines 525 may extend upward (and/or outward) from one or more pads 520 provided on the top surface and/or the bottom surface of the thermally conductive spacer 505 to the cover 530.

In an example, the cover 530 includes multiple layers of metal and acts as a thermal dissipation layer. For example, a first layer and third layer of the cover 530 may be formed from FR4, aluminum, and/or stainless steel and a second layer may be formed from copper. In another example, the cover 530 may include one or more tin layers, one or more copper layers, one or more nickel layers and/or one or more aluminum layers. Although specific layers/materials are mentioned, the cover 530 may be formed from any metal material having thermal/electrical conductivity properties.

In an example, the tines 525 may contact one or more semiconductor dies 515 in the stack of semiconductor dies 510 to provide mechanical support. In another example, the tines 525 may act as a cage or other protective feature for the stack of semiconductor dies 510.

In either example, the tines 525 may help protect or may otherwise prevent the stack of semiconductor dies 510 from moving if the semiconductor package 500 is dropped. In another example, the semiconductor package 500 may be removed and/or inserted into a computing component or an electronic device multiple times. Accordingly, the tines 525 may increase a mechanical strength of the stack of semiconductor dies 510 and/or the semiconductor package 500.

Figure 6:
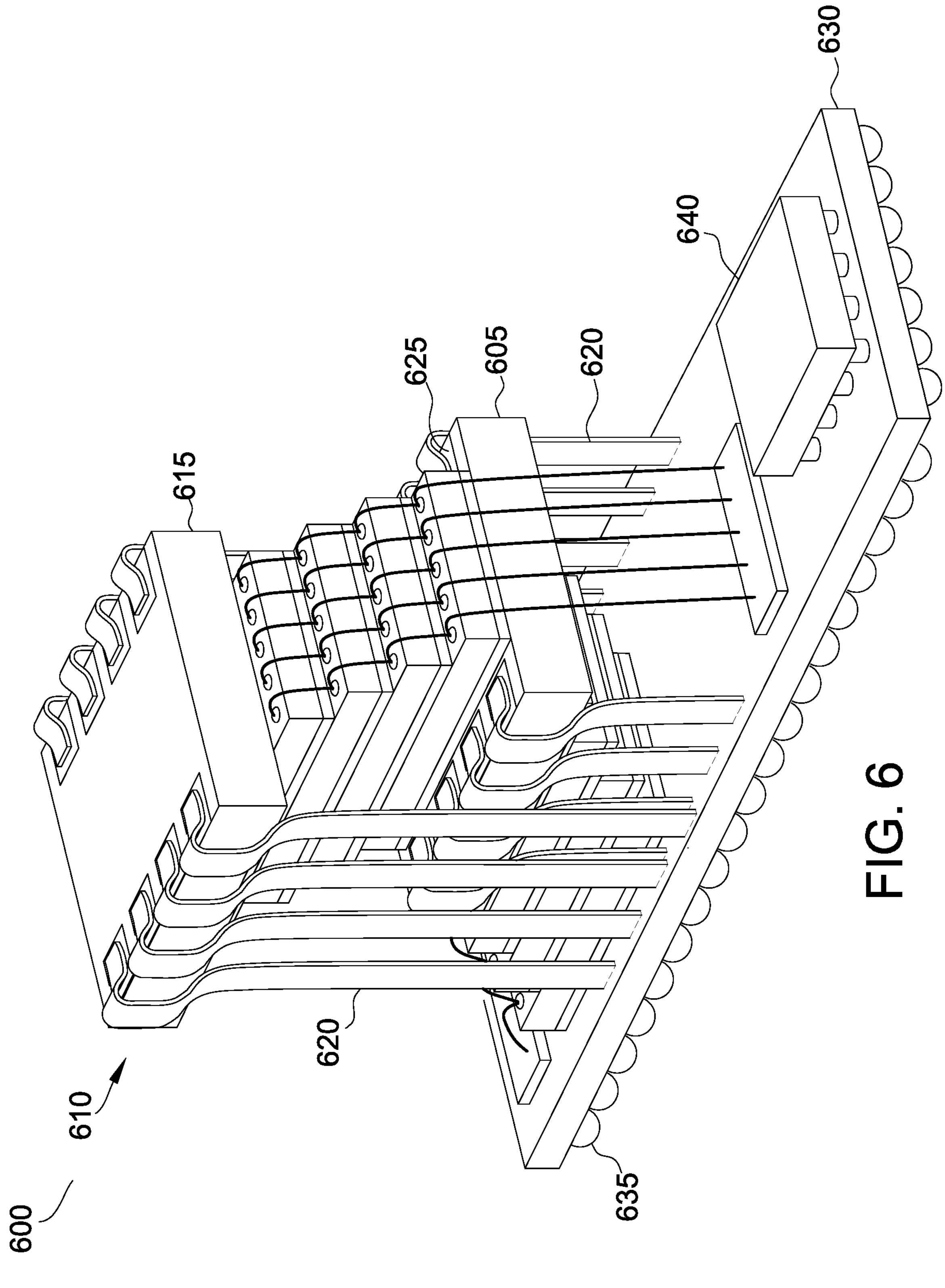
FIG. 6 illustrates an isometric view of a semiconductor package having multiple thermally conductive spacers according to an example.

FIG. 6 illustrates an isometric view of a semiconductor package 600 having multiple thermally conductive spacers according to an example. For example, the semiconductor package 600 includes a first thermally conductive spacer 605 positioned at or a near a middle of a stack of semiconductor dies 610 and a second thermally conductive spacer 615 positioned at or near a top of the stack of semiconductor dies 610.

As with other examples described herein, the semiconductor package 600 may be similar to the semiconductor package 100 shown and described with respect to FIG. 1. For example, the semiconductor package 600 includes a controller 640 or other integrated circuit and a stack of semiconductor dies 610 in addition to the thermally conductive spacers. Likewise, the first thermally conductive spacer 605 and/or the second thermally conductive spacer 615 may be similar to the thermally conductive spacer 105 shown and described with respect to FIG. 1.

In this example, each of the first thermally conductive spacer 605 and the second thermally conductive spacer 615 include one or more tines 620 or leads that extend from a surface of each thermally conductive spacer. The tines 620 may extend from one or more pads 625 provided on the top surface and/or the bottom surface of each thermally conductive spacer.

In this example, the tines 620 extend from the first thermally conductive spacer 605 and/or the second thermally conductive spacer 615 to a printed circuit board (PCB) 630 of the semiconductor package 600. In such an example, the tines 620 may be electrically coupled to one or more solder balls 635 provided on a bottom surface of the PCB 630 which may further help dissipate heat from the semiconductor package 600.

As with the other examples described herein, the tines 620 may provide additional mechanical support to the stack of semiconductor dies 610. For example, the tines 620 may form a cage or other protective feature around the stack of semiconductor dies 610. Additionally, although FIG. 6 shows the tines extending toward the PCB 630, the tines 620 may extend in any direction within the semiconductor package 600.

Accordingly, examples of the present disclosure describe a semiconductor package, comprising: a printed circuit board (PCB); a first stack of semiconductor dies; a second stack of semiconductor dies; and a thermally conductive spacer provided between the first stack of semiconductor dies and the second stack of semiconductor dies, the thermally conductive spacer comprising: a thermal conductivity feature that moves heat generated by the semiconductor dies adjacent to the thermally conductive spacer away from the adjacent semiconductor dies. In an example, a set of dimensions of the thermally conductive spacer are greater than a set of dimensions of at least one semiconductor die associated with the first stack of semiconductor dies. In an example, the thermal conductivity feature comprises a thermal conductive material provided on one or more of a top surface of the thermally conductive spacer and a bottom surface of the thermally conductive spacer. In an example, the thermal conductive material is arranged in a grid pattern. In an example, the thermal conductivity feature comprises one or more vias provided at least partially through the thermally conductive spacer. In an example, the one or more vias are filled with a thermal conductive material. In an example, one or more tines extend from a surface of the thermally conductive spacer to a surface of the PCB. In an example, the one or more tines extend from the surface of the thermally conductive spacer to a cover associated with the semiconductor package. In an example, at least one of the first stack of semiconductor dies and the second stack of semiconductor dies is a stack of NAND memory dies. In an example, the thermally conductive spacer is comprised of a thermal conductive material.

In another example, a semiconductor package is described. The semiconductor package comprises: a printed circuit board (PCB); a stack of memory dies, each memory die of the stack of memory dies having a first set of dimensions; and a thermally conductive spacer provided between a first memory die of the stack of memory dies and a second memory die of the stack of memory dies, the thermally conductive spacer having a thermal conductivity feature and having a second set of dimensions that are larger than the first set of dimensions. In an example, the thermal conductivity feature comprises a thermal conductive material provided on one or more of a top surface of the thermally conductive spacer and a bottom surface of the thermally conductive spacer. In an example, the thermal conductivity feature comprises one or more vias provided at least partially through the thermally conductive spacer. In an example, the one or more vias are filled with a thermal conductive material. In an example, the semiconductor package includes one or more pads provided on an exposed surface of the thermally conductive spacer. In an example, the semiconductor package includes one or more tines extending from the one or more pads provided on the exposed surface of the thermally conductive spacer. In an example, the one or more tines extend from the surface of the thermally conductive spacer to the PCB. In an example, the one or more tines extend from the surface of the thermally conductive spacer to a cover associated with the semiconductor package.

In another example, a semiconductor package, comprises: a first stack of integrated circuit means; a second stack of integrated circuit means; a thermally conductive spacing means provided between the first stack of integrated circuit means and the second stack of integrated circuit means, the thermally conductive spacing means comprising: a thermal conductivity means; and a set of dimensions that are greater than a set of dimensions of at least one integrated circuit means in the first stack of integrated circuit means. In an example, the thermal conductivity means is provided on one or more of a top surface of the thermally conductive spacing means and a bottom surface of the thermally conductive spacing means.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features are intended to be selectively rearranged, included or omitted to produce various embodiments with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A semiconductor package, comprising:
a printed circuit board (PCB);
a first stack of semiconductor dies;
a second stack of semiconductor dies; and
a thermally conductive spacer provided between the first stack of semiconductor dies and the second stack of semiconductor dies, the thermally conductive spacer comprising:
a thermally conductive material; and
a thermal conductivity feature that moves heat generated by the semiconductor dies adjacent to the thermally conductive spacer away from the adjacent semiconductor dies.

2. The semiconductor package of claim 1, wherein each dimension of a set of dimensions of the thermally conductive spacer is greater than a corresponding dimension of at least one semiconductor die associated with the first stack of semiconductor dies.

3. The semiconductor package of claim 1, wherein the thermal conductivity feature comprises a thermally conductive material provided on one or more of a top surface of the thermally conductive spacer and a bottom surface of the thermally conductive spacer.

4. The semiconductor package of claim 3, wherein the thermally conductive material is arranged in a grid pattern.

5. The semiconductor package of claim 1, wherein the thermal conductivity feature comprises one or more vias provided at least partially through the thermally conductive spacer.

6. The semiconductor package of claim 5, wherein the one or more vias are filled with a thermally conductive material.

7. The semiconductor package of claim 1, further comprising one or more tines extending from a surface of the thermally conductive spacer to a surface of the PCB.

8. The semiconductor package of claim 7, wherein the one or more tines extend from the surface of the thermally conductive spacer to a cover associated with the semiconductor package.

9. The semiconductor package of claim 7, wherein the one or more tines contact one or more semiconductor dies in the first stack of semiconductor dies and the second stack of semiconductor dies and provide mechanical support.

10. The semiconductor package of claim 1, further comprising a second thermally conductive spacer provided between a third stack of semiconductor dies and a fourth stack of semiconductor dies.

11. A semiconductor package, comprising:
a printed circuit board (PCB);
a stack of memory dies, each memory die of the stack of memory dies having a first set of dimensions;
a thermally conductive spacer provided between a first memory die of the stack of memory dies and a second memory die of the stack of memory dies, the thermally conductive spacer having a thermal conductivity feature and having a second set of dimensions, wherein each dimension of the second set of dimensions is larger than a corresponding dimension of the first set of dimensions; and
one or more pads provided on an exposed surface of the thermally conductive spacer.

12. The semiconductor package of claim 11, wherein the thermal conductivity feature comprises a thermally conductive material provided on one or more of a top surface of the thermally conductive spacer and a bottom surface of the thermally conductive spacer.

13. The semiconductor package of claim 11, wherein the thermal conductivity feature comprises one or more vias provided at least partially through the thermally conductive spacer.

14. The semiconductor package of claim 13, wherein the one or more vias are filled with a thermally conductive material.

15. The semiconductor package of claim 11, further comprising one or more tines extending from the one or more pads provided on the exposed surface of the thermally conductive spacer.

16. The semiconductor package of claim 15, wherein the one or more tines extend from the exposed surface of the thermally conductive spacer to the PCB.

17. The semiconductor package of claim 15, wherein the one or more tines extend from the exposed surface of the thermally conductive spacer to a cover associated with the semiconductor package.

18. The semiconductor package of claim 11, wherein the one or more pads comprise a thermally conductive material and are provided proximate to an edge of the thermally conductive spacer.

19. A semiconductor package, comprising:
a first stack of integrated circuit means;
a second stack of integrated circuit means;
a thermally conductive spacing means provided between the first stack of integrated circuit means and the second stack of integrated circuit means, the thermally conductive spacing means comprising:

a thermally conductive material; and a thermal conductivity means that conducts heat generated by integrated circuit means adjacent to the thermally conductive spacing means away from the integrated circuit means adjacent to the thermally conductive spacing means.

20. The semiconductor package of claim 19, wherein the thermal conductivity means is provided on one or more of a top surface of the thermally conductive spacing means and a bottom surface of the thermally conductive spacing means.

* * * * *